(12) United States Patent
Lu et al.

(10) Patent No.: US 6,344,785 B1
(45) Date of Patent: *Feb. 5, 2002

(54) ELECTRONIC SURFACE MOUNT PACKAGE

(75) Inventors: Peter Lu, Flower Mound, TX (US); Jeffrey Heaton, Cupertino; James W. Heaton, Los Altos, both of CA (US); Peter Loh Hang Pao, Kowloon (HK); Robert Loke Hang Lam, Wonderland Villas (HK); Tsang Kei Sun, Kowloon (HK)

(73) Assignee: Halo Electronics, Inc., Redwood City, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/906,952

(22) Filed: Aug. 6, 1997

Related U.S. Application Data

(63) Continuation of application No. 08/513,573, filed on Aug. 10, 1995, now Pat. No. 5,656,985.

(51) Int. Cl.[7] .............................................. H01F 27/02
(52) U.S. Cl. ............................ 336/96; 336/90; 336/192
(58) Field of Search ................................ 336/192, 229, 336/65, 96, 90; 174/52.4, 50; 361/821, 752

(56) References Cited

U.S. PATENT DOCUMENTS 3,721,747 A   3/1973   Renskers ................ 174/52 PE
5,034,854 A * 7/1991   Matsumura et al. ........ 336/192

FOREIGN PATENT DOCUMENTS

EP   0 490 438 A1   6/1992   ........... H01F/31/00

OTHER PUBLICATIONS

McCormick; Surface Mount Transformers: A New Packaging Approach; Surface Mount Technology; Feb. 1993; pp. 27–31.
Wyns et al.; PSPICE Simulations and 3D–PCB Transformers for ZVS Full Bridge Converters; The European Power Electronics Association; 1993; pp. 208–214.
EPE'93 Fifth European Conference; Power Electronics and Applications; vol. 3: Electronic Power Supply System; Sep. 13–16, 1993; pp. 215.
Davis; SMT Passive Components Fit Power Electronics Applications; PCIM; Jun. 1993; vol. 19; No. 6; pp. 20–28 and 90.
Osawa; A Superminiaturized Double–Balanced SMT Mixer–Modulator; Microwave Journal; Feb. 1994; pp. 90–97.
Lyons et al.; Printed Circuit Board Magnetics: A New Approach to the Mass Production of Toroidal Transformers; ISHM '95 Proceedings; pp. 53–58.
Derebail et al.; Knowledge Based Adhesive Selection for SMT Assemblies; Proceedings 1995 International Symposium on Microelectronics; Oct. 24–26, 1995; vol. 2649; pp. 1024–1035.

* cited by examiner

Primary Examiner—Anh Mai
(74) Attorney, Agent, or Firm—Stephen E. Baldwin

(57) ABSTRACT

An electronic surface mount package provides a one piece construction package (with an open bottom) with one or more terminal pins molded into the package. Each of the pins have a notched post upon which a wire is wound which is from a toroid transformer carried within the package. Each of the posts are notched so their respective wires are separate from one another so as to prevent arcing. The case is opened at the bottom which prevents harm from expansion or cracking.

34 Claims, 5 Drawing Sheets

ELECTRONIC SURFACE MOUNT PACKAGE

This application is a continuation of Ser. No. 08/513,573 filed on Aug. 10, 1995 U.S. Pat. No. 5,656,985

BACKGROUND OF THE INVENTION

The present invention relates to an electronic surface mount package or case. Electronic surface mount packages are utilized in applications in which one or more individual toroid transformers are embodied within the surface mount package.

Wires coming off the transformers are electronically tied to pins on the package for connection to an electronic device. Typically, the electronic surface mount packages are mounted on a printed circuit board for utilization in the electronic device.

SUMMARY OF THE INVENTION

It is an object of the present invention to provide an improved electronic surface mount package.

Briefly, according to one preferred embodiment, the present invention provides a one piece construction package (with an open bottom) with one or more terminal pins molded into the package. Each of the pins have a notched post upon which a wire is wound which is from a toroid transformer carried within the package. Each of the posts are notched so that the respective wires are separated from one another so as to avoid arcing. The case is open at the bottom which prevents harm from expansion or cracking.

Other objects, features, and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE DRAWINGS

Reference will now be made in detail to the preferred embodiments of the invention, examples of which are illustrated in the accompanying drawings, where like numerals indicate like components. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
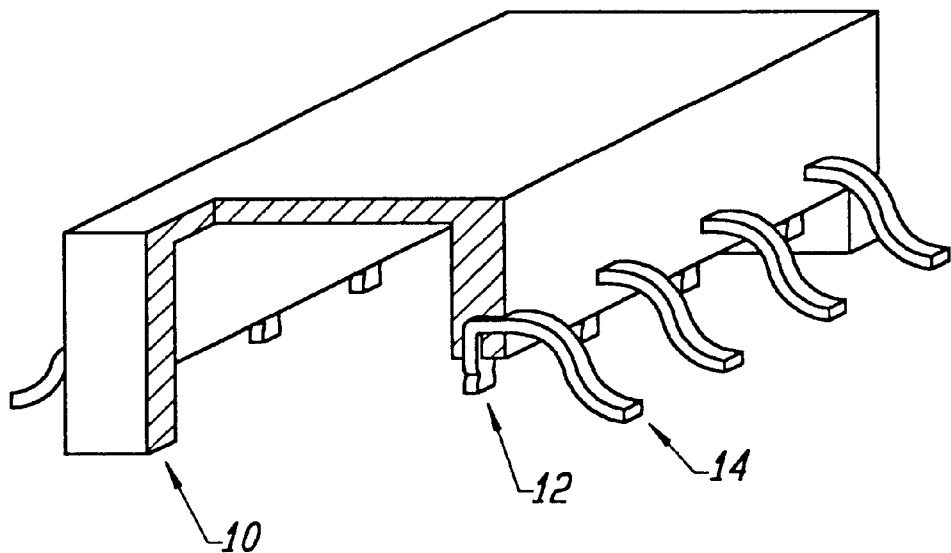
FIG. 1 shows an electronic surface mount package in three-dimensional view according to the present invention.

FIG. 1 shows an electronic surface mount transformer package or case 10 in three-dimensional view. FIG. 1 shows a cut-away of the generally rectangular empty case 10 with pins 14 molded into the case 10, together with notched post 12 upon which a wire is wound. Typically, tin-Lead plated copper alloy terminals are molded into the wall of the package 10. The outer portion of the package 10 is formed to meet specified footing requirements. The inner post 12 serves as a terminal for internal wire termination use. The package material is made of a type of thermal plastic which is in compliance with UL V-94 requirement for flammability.

Figure 2:
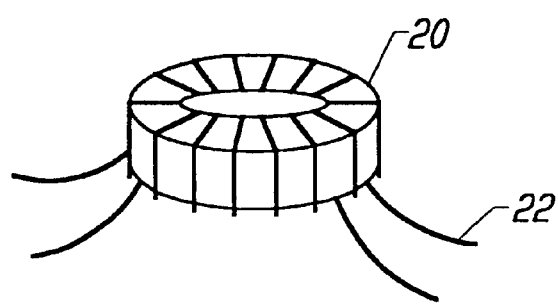
FIG. 2 shows a wound toroid transformer.

FIG. 2 shows a wound toroid transformer 20 with wire 22 wrapped around the transformer 20. The toroid core is typically made of ferrite or iron material and the winding of wire 22 is done manually with fine insulated magnet wire.

Figure 3:
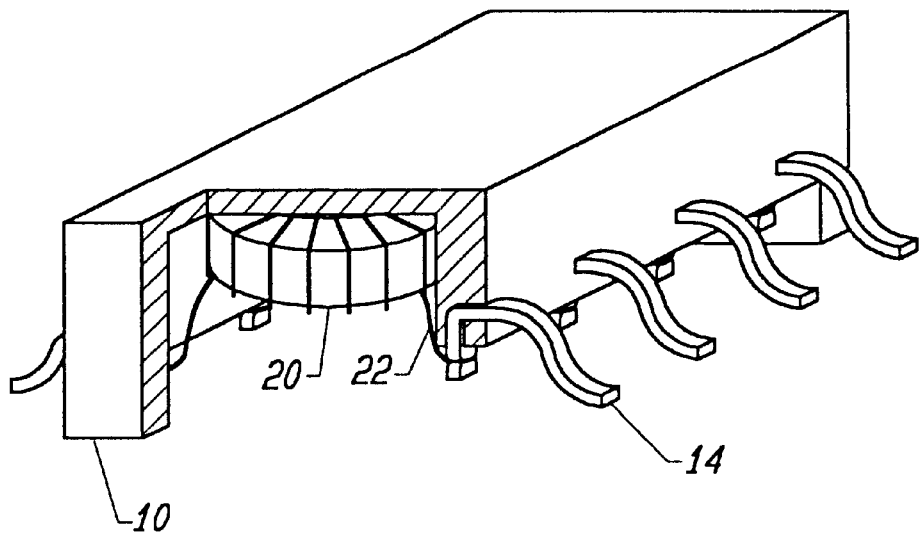
FIG. 3 shows the connection of the toroid transformer of FIG. 2 within the electronic surface mount package of FIG. 1.

FIG. 3 shows a cut-away of the molded part with the toroid 20 mounted inside and showing the wire 22 as it is then attached to post 14. The wires 22 are pulled with minimum tension and wrapped around the terminal post 14 for two to two and a half turns. This operation is done when the case has been placed bottom side up.

Figure 4:
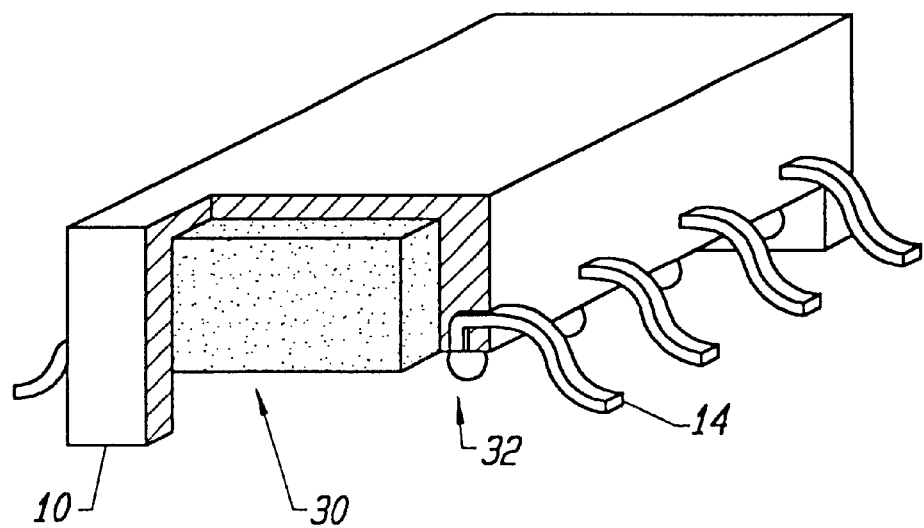
FIG. 4 shows the electronic surface mount package of FIG. 1 after wire terminations have been soldered.

FIG. 4 shows a silicon compound 30 poured inside the cavity with wire terminations that have been soldered with high temperature solder (95 Ag/5 Sn) 32 and the package has been properly cleaned. The case 10 is then filled with soft silicone material to protect the transformer and to meet environmental requirements.

Figure 5:
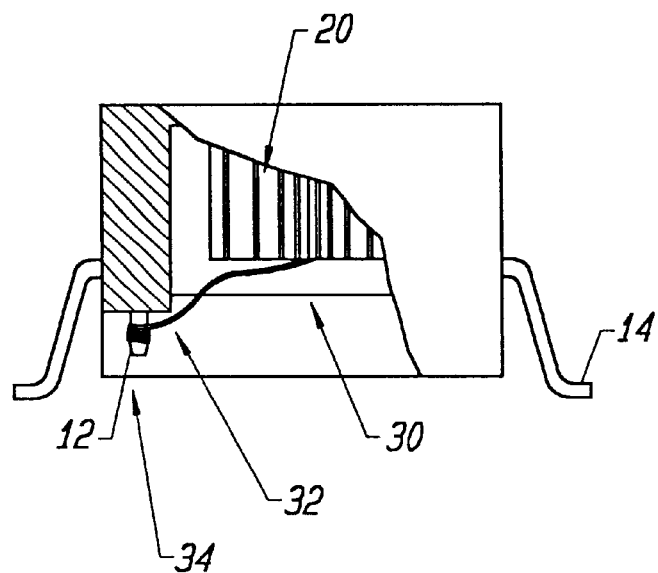
FIGS. 5 and 6 show relationships between a safeguard (standoff) and the electronic surface-mount package's foot seating plane and inner terminal posts, respectively.
Figure 6:
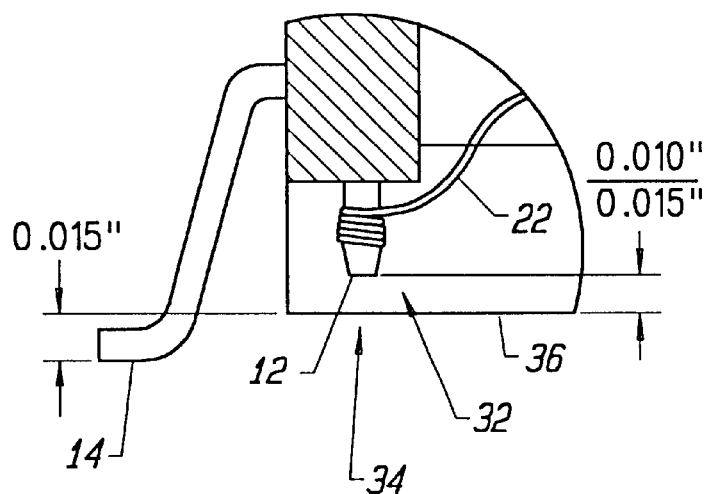

FIGS. 5 and 6 show the relationships between the safe guard (stand off) 34 and package's foot seating plane and inner terminal posts 12a. FIG. 5 shows the standoff 34, in which the parts typically are placed automatically by machine onto a PC board. They are pressed down, as it is desirable to have some limitation of how far they can be pressed. It is also desirable that the post 12 does not touch the PC board, and so the end standoffs 34 do not allow that to happen.

FIG. 6 shows the distance in relationship between the end of the post 12 and where the PC board 36 is located and also where the standoff 34 ends. The PC board 36 would be at the base of the foot.

In FIG. 6, the typical clearance of 0.015 inches from the safe guard 34 to the seating plane is to avoid interference to the coplanarity of the package. There is also a gap between the safe guard 34 and terminal post 12 to prevent the solder joints from touching the circuit board due to an over forced pick and place operation.

Inside the package 10, there may be two, three, or more individual toroidal transformers. Wires coming off of the transformers are connected to the outside world. For example, the pins may be mounted on a printed circuit board in an electronic device. The lead frame pins are injection molded and the shape of the post upon which the wire is wound from the toroidal transformer is notched. This allows for the wires to be separated from pin to pin, and for soldering to be much more efficient.

Figure 7:
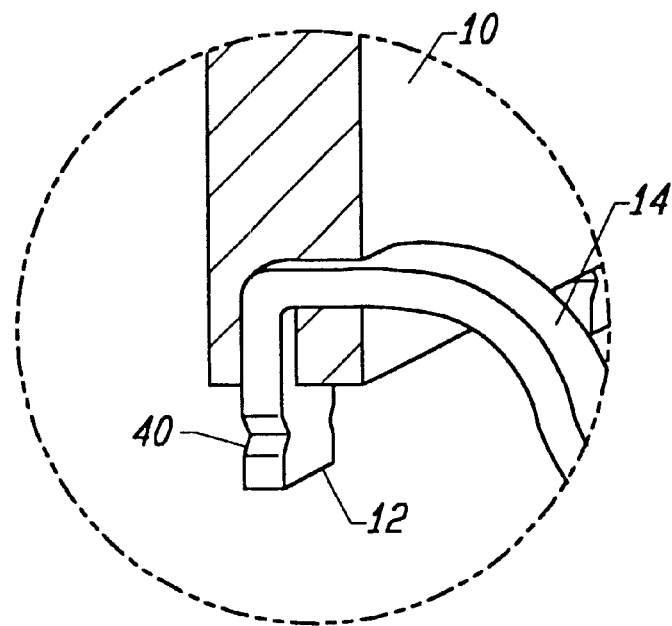
FIG. 7 shows a close-up of the pin configuration of FIG. 1 and how it is molded inside the wall of the body of the package.

FIG. 7 shows a closeup of the pin 12 and how pin 12 is molded inside the wall of the body and also the notch effect 40 of the pin 12. The post 14 is notched so that the wires are kept away from one another (post to post) which is very desirable. The separation is desirable so as to avoid arcing.

Figure 8:
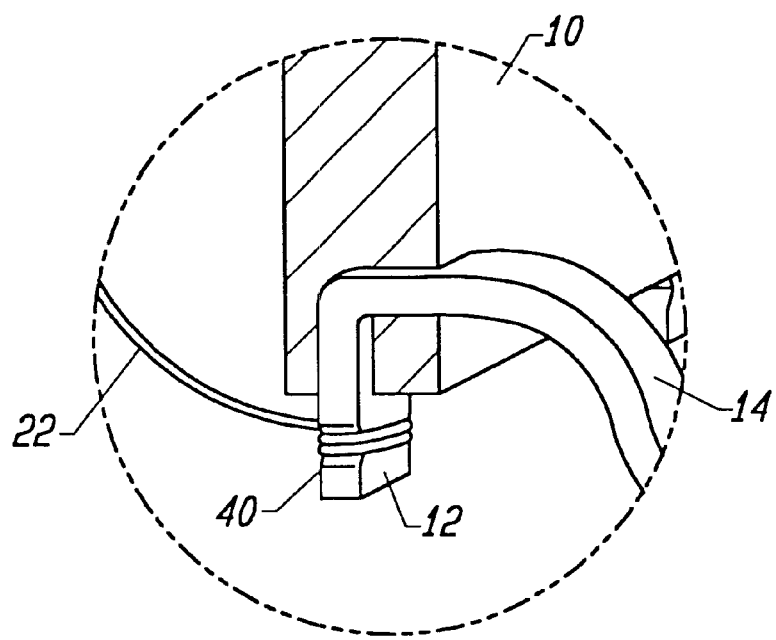
FIG. 8 shows wire wrapped around the pin or post of FIG. 7.
Figure 9B:
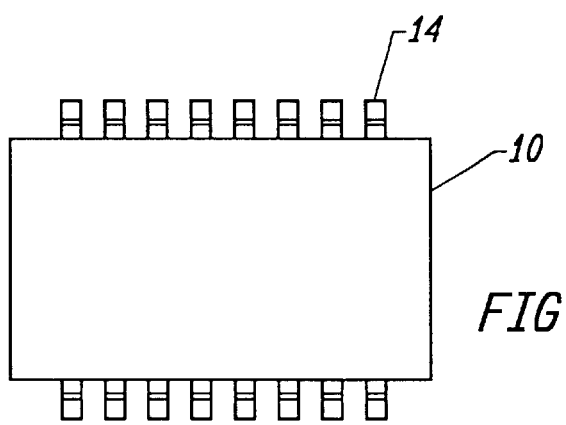
FIGS. 9A–9D show end, top, side, and bottom views of electronic surface mount package according to the present invention.
Figures 9A, 9C:
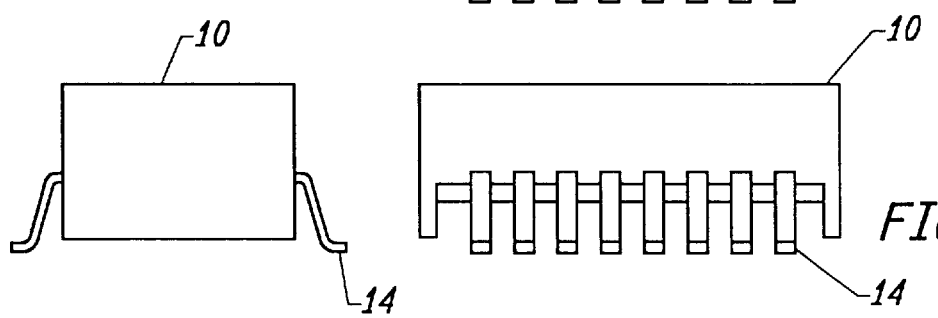
Figure 9D:
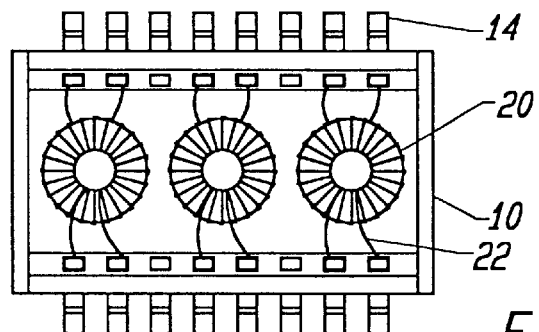

FIG. 8 shows the wire 22 wrapped around the pin or post 12.

FIGS. 9A–9D show end, top, side, and bottom views, respectively, of the electronic surface mount package 10. The embodiment shown in FIGS. 9A–9D provide an industrial standard surface mount footprint and package dimensions which are auto pick and placeable. In addition, special design consideration has been applied to thermal expansion of materials to ensure that the package will stand all normal reflow processes with low cost, easy manufacturing, and high reliability.

In the industry, many manufacturers have used a two-piece construction, a base and a cover, and the case is backfilled with epoxy. In some processes, the coefficients of expansion of the epoxy that has been backfilled, plus the toroid itself, tend to cause the two pieces to separate. The base separates from the top, and as a result, it can end up cracking. The present invention provides a one-piece construction (an open bottom) only with the silicon filling to protect the toroid. The case is open at the bottom, thus allowing for nothing to expand or crack.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An electronic surface mount package for mounting onto the surface of a printed circuit board comprising:
   a side wall with a bottom end,
   a plurality of toroid transformers within the package, the toroid transformers each having wires wrapped thereon,
   a plurality of terminal pins molded within the side wall, each of the pins extending through the side wall and having a solder post with an end upon which the wires from the transformers are respectively wrapped and soldered thereon, each of the post ends extending beyond the bottom end of the side wall.

2. The package of claim 1 wherein the plurality of toroid transformers are carried within the package by a soft silicone material.

3. The package of claim 1 wherein the side wall has an exterior surface which defines the periphery of the package and each of the solder post ends extends from within the periphery of the package and beyond the bottom of the side wall.

4. The package of claim 1 wherein the side wall defines an interior space within the package and each of the post ends extends from the interior space and beyond the bottom of the side wall.

5. The package of claim 4 wherein each of the solder post ends extends from within the periphery in a direction parallel to the side wall.

6. The package of claim 1 wherein the construction package is one piece.

7. The package of claim 1 wherein each of the pins has a notch near the post end upon which the wires from the transformers are wrapped.

8. The package of claim 1 wherein the posts are separated from one another so as to avoid arcing.

9. An electronic surface mount package for mounting onto the surface of a printed circuit board comprising:
   a side wall and a standoff, the standoff defining a foot seating plane for the surface mount of the package, the side wall having a bottom end with an elevation higher than the standoff so as to be above and beyond the foot seating plane;
   a plurality of toroid transformers within the package, the toroid transformers each having wires wrapped thereon,
   a plurality of terminal pins molded within the package, each of the pins having a solder post with an end upon which the wires from the transformers are respectively wrapped and soldered thereon, the solder post ends extending beyond the bottom end of the side wall to a position above the foot seating plane.

10. The package of claim 9 wherein each of the pins has a notch near the post end upon which the wires from the transformers are wrapped.

11. The package of claim 9 wherein the construction package is one piece.

12. The package of claim 9 wherein the construction package has an open bottom.

13. The package of claim 9 wherein the posts are separated from one another so as to avoid arcing.

14. The package of claim 9 wherein the side wall defines an interior space within the package and each of the post ends extends from the interior space and beyond the bottom of the side wall.

15. The package of claim 14 wherein each of the post ends extends from within the periphery in a direction parallel to the side wall.

16. The package of claim 9 wherein the plurality of toroid transformers are within the package and secured by a soft silicone material.

17. The package of claim 9 wherein the standoff is a pair of end walls with the side wall extending on opposing sides therebetween.

18. An electronic surface mount package for mounting onto the surface of a circuit board, the package comprising:
   a side wall having a bottom end;
   a standoff for surface mounting the package to the circuit board;
   a gap between the bottom end of the side wall and the standoff;
   a plurality of toroid transformers within the package, the toroid transformers each having wire wrapped thereon,
   a plurality of terminal pins molded within the package, each of the pins having a solder post with an end upon which the wires from the transformers are respectively wrapped and soldered thereon, each of the solder post ends extending into and terminating within the gap.

19. The package of claim 18 wherein the standoff is a pair of end walls with the side wall extending on opposing sides therebetween.

20. The package of claim 18 wherein the construction package is one piece.

21. The package of claim 18 wherein the construction package has an open bottom.

22. The package of claim 18 wherein the posts are separated from one another so as to avoid arcing.

23. The package of claim 18 wherein the side wall defines an interior space within the package and each of the post ends extends from the interior space and beyond the bottom of the side wall.

24. The package of claim 23 wherein each of the post ends extends from within the periphery in a direction parallel to the side wall.

25. The package of claim 18 wherein the plurality of toroid transformers are within the package and secured by a soft silicone material.

26. An electronic surface mount package for mounting onto the surface of a printed circuit board comprising:

a one piece package having an open bottom and a side wall with a bottom end;

a plurality of toroid transformers each having wires wrapped thereon;

means for encapsulating the plurality of toroid transformers within the package;

a plurality of terminal pins molded within and extending from the bottom of the package, each of the pins extending through the side wall and having a solder post with an end upon which the wires from the transformers are respectively wrapped and soldered thereon.

27. The package of claim 26 wherein the standoff is a pair of end walls with the side wall extending on opposing sides therebetween.

28. The package of claim 26 wherein each of the post ends extends beyond the bottom end of the side wall.

29. The package of claim 26 wherein the carrying means includes encapsulating the plurality of toroid transformers within the package by a soft silicone material.

30. The package of claim 26 wherein the construction package is one piece.

31. The package of claim 26 wherein the posts are separated from one another so as to avoid arcing.

32. The package of claim 26 wherein the side wall defines an interior space within the package and each of the post ends extends from the interior space and beyond the bottom of the side wall.

33. The package of claim 32 wherein each of the post ends extends from within the periphery in a direction parallel to the side wall.

34. The package of claim 26 wherein the package includes a standoff defining a foot seating plane for the surface mount of the package, the side wall having a bottom end with an elevation higher than the standoff so as to be above and beyond the foot seating plane, the post ends extending beyond the bottom end of the side wall to a position above the foot seating plane.

* * * * *

(12) EX PARTE REEXAMINATION CERTIFICATE (7271st)
United States Patent
Lu et al.

(10) Number: US 6,344,785 C1
(45) Certificate Issued: *Dec. 29, 2009

(54) ELECTRONIC SURFACE MOUNT PACKAGE

(75) Inventors: Peter Lu, Flower Mound, TX (US);
Jeffrey Heaton, Cupertino, CA (US);
James W. Heaton, Los Altos, CA (US);
Peter Loh Hang Pao, Kowloon (HK);
Robert Loke Hang Lam, Wonderland Villas (HK); Tsang Kei Sun, Kowloon (HK)

(73) Assignee: Halo Electronics, Inc., Redwood City, CA (US)

Reexamination Request:
No. 90/009,138, May 5, 2008

Reexamination Certificate for:
Patent No.: 6,344,785
Issued: Feb. 5, 2002
Appl. No.: 08/906,952
Filed: Aug. 6, 1997

(*) Notice: This patent is subject to a terminal disclaimer.

Related U.S. Application Data

(63) Continuation of application No. 08/513,573, filed on Aug. 10, 1995, now Pat. No. 5,656,985.

(51) Int. Cl.
*H01F 27/02* (2006.01)

(52) U.S. Cl. .............. 336/96; 336/90; 336/192
(58) Field of Classification Search .............. None
See application file for complete search history.

(56) References Cited

U.S. PATENT DOCUMENTS

| | | | |
|---|---|---|---|
| 3,353,124 A | 11/1967 | Dilger | |
| 3,721,747 A * | 3/1973 | Renskers | 174/532 |
| 4,789,847 A | 12/1988 | Sakamoto et al. | |
| 4,930,200 A | 6/1990 | Brush, Jr. et al. | |
| 5,069,641 A | 12/1991 | Sakamoto et al. | |
| 5,212,345 A * | 5/1993 | Gutierrez | 174/556 |
| 5,277,625 A | 1/1994 | Iannella et al. | |
| 5,309,130 A | 5/1994 | Lint | |
| 5,321,372 A | 6/1994 | Smith | |
| 5,337,028 A | 8/1994 | White | |
| 5,587,884 A | 12/1996 | Raman | |
| 5,805,431 A | 9/1998 | Joshi et al. | |
| 6,116,963 A | 9/2000 | Shutter | |
| 6,769,936 B2 | 8/2004 | Gutierrez et al. | |

FOREIGN PATENT DOCUMENTS

JP 07161535 * 6/1995

OTHER PUBLICATIONS

Harold Tischler, "Mounting and Packaging Techniques for Toroidal Devices", Proceedings of Electrical Electronics Insulation Conference and Electrical Manufacturing & Coil Winding Conference, Oct. 1993, pp. 261–262.*

Brad J. McCormick et al., "Surface Mount Transformers: A New Packaging Approach", Surface Mount Technology, Feb. 1993, pp. 27–31.*

Nano Pulse Industries, Catalog page for SMD 10BaseT Transformers, Jun. 1994.*

Nano Pulse Industries, Catalog page for Ethernet Isolation Transformers, Jun. 1994.*

* cited by examiner

*Primary Examiner*—Tuan H Nguyen

(57) ABSTRACT

An electronic surface mount package provides a one piece construction package (with an open bottom) with one or more terminal pins molded into the package. Each of the pins have a notched post upon which a wire is wound which is from a toroid transformer carried within the package. Each of the posts are notched so their respective wires are separate from one another so as to prevent arcing. The case is opened at the bottom which prevents harm from expansion or cracking.

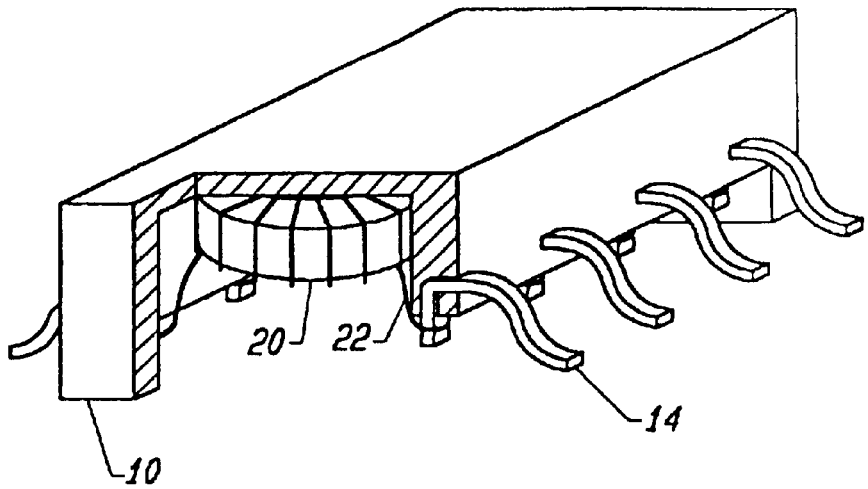

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–34 is confirmed.

New claims 35–56 are added and determined to be patentable.

35. *An electronic surface mount package for mounting onto the surface of a printed circuit board comprising:*
   *a first side wall with a bottom end,*
   *a plurality of toroid transformers within the package, the toroid transformers each having wires wrapped thereon,*
   *a plurality of terminal pins molded within the first side wall, each of the pins extending through the first side wall and having a solder post with an end upon which the wires from the transformers are respectively wrapped and soldered thereon, each of the post ends extending beyond the bottom end of the first side wall, wherein each of the post ends is substantially parallel to the first side wall, and a portion of each of the terminal pins extends from and is substantially perpendicular to the first side wall, each of the terminal pins further including a lead for mounting onto the surface of the printed circuit board,*
   *an end wall substantially perpendicular to the first side wall, wherein at least a portion of the end wall extends below the post ends, and*
   *a second side wall substantially parallel to the first side wall, and wherein the wires from the transformers are contained between first and second planes defined, respectively, by an outside surface of the first side wall and an outside surface of the second side wall.*

36. *The package of claim 35, wherein the portion of the end wall that extends below the post ends includes a central section of a lower surface of the end wall.*

37. *The package of claim 35, wherein the package has an open bottom.*

38. *The package of claim 35, wherein the package further includes a resilient material to secure the plurality of toroid transformers within the package.*

39. *The package of claim 35, wherein each of the terminal pins has a nonlinear portion disposed within the first side wall, and the nonlinear portion includes a first segment and a second segment substantially perpendicular to the first segment.*

40. *An electronic surface mount package for mounting onto the surface of a printed circuit board comprising:*
   *a first side wall with a bottom end,*
   *a plurality of toroid transformers within the package, the toroid transformers each having wires wrapped thereon,*
   *a plurality of terminal pins molded within the first side wall, each of the pins extending through the first side wall and having a solder post with an end upon which the wires from the transformers are respectively wrapped and soldered thereon, each of the post ends extending beyond the bottom end of the first side wall, wherein each of the post ends is substantially parallel to the first side wall, and a portion of each of the terminal pins extends from and is substantially perpendicular to the first side wall, each of the terminal pins further including a lead for mounting onto the surface of the printed circuit board, and*
   *a second side wall substantially parallel to the first side wall, and wherein the wires from the transformers are contained between first and second planes defined, respectively, by an outside surface of the first side wall and an outside surface of the second side wall.*

41. *The package of claim 40, wherein the package has an open bottom.*

42. *The package of claim 40, wherein the package further includes a resilient material to secure the plurality of toroid transformers within the package.*

43. *The package of claim 40, wherein each of the terminal pins has a nonlinear portion disposed within the first side wall, and the nonlinear portion includes a first segment and a second segment substantially perpendicular to the first segment.*

44. *An electronic surface mount package for mounting onto the surface of a printed circuit board comprising:*
   *a first side wall and a standoff, the standoff defining a foot seating plane for the surface mount of the package, the first side wall having a bottom end with an elevation higher than the standoff so as to be above and beyond the foot seating plane;*
   *a plurality of toroid transformers within the package, the toroid transformers each having wires wrapped thereon,*
   *a plurality of terminal pins molded within the package, each of the pins having a solder post with an end upon which the wires from the transformers are respectively wrapped and soldered thereon, the solder post ends extending beyond the bottom end of the first side wall to a position above the foot seating plane, wherein each of the post ends is substantially parallel to the first side wall, and a portion of each of the terminal pins extends from and is substantially perpendicular to the first side wall, each of the terminal pins further including a lead for mounting onto the surface of the printed circuit board, and*
   *a second side wall substantially parallel to the first side wall, and wherein the wires from the transformers are contained between first and second planes defined, respectively, by an outside surface of the first side wall and an outside surface of the second side wall.*

45. *The package of claim 44, wherein the package has an open bottom.*

46. *The package of claim 44, wherein the package further includes a resilient material to secure the plurality of toroid transformers within the package.*

47. *The package of claim 44, wherein each of the terminal pins has a nonlinear portion disposed within the first side wall, and the nonlinear portion includes a first segment and a second segment substantially perpendicular to the first segment.*

48. *An electronic surface mount package for mounting onto the surface of a circuit board, the package comprising:* a first side wall having a bottom end;

a standoff for surface mounting the package to the circuit board;

a gap between the bottom end of the first side wall and the standoff;

a plurality of toroid transformers within the package, the toroid transformers each having wire wrapped thereon, a plurality of terminal pins molded within the package, each of the pins having a solder post with an end upon which the wires from the transformers are respectively wrapped and soldered thereon, each of the solder post ends extending into and terminating within the gap, wherein each of the post ends is substantially parallel to the first side wall, and a portion of each of the terminal pins extends from and is substantially perpendicular to the first side wall, each of the terminal pins further including a lead for mounting onto the surface of the printed circuit board, and a second side wall substantially parallel to the first side wall, and wherein the wires from the transformers are contained between first and second planes defined, respectively, by an outside surface of the first side wall and an outside surface of the second side wall.

49. The package of claim 48, wherein the package has an open bottom.

50. The package of claim 48, wherein the package further includes a resilient material to secure the plurality of toroid transformers within the package.

51. The package of claim 48, wherein each of the terminal pins has a nonlinear portion disposed within the first side wall, and the nonlinear portion includes a first segment and a second segment substantially perpendicular to the first segment.

52. An electronic surface mount package for mounting onto the surface of a printed circuit board comprising:

a one piece package having an open bottom and a first side wall with a bottom end;

a plurality of toroid transformers each having wires wrapped thereon;

means for encapsulating the plurality of toroid transformers within the package;

a plurality of terminal pins molded within and extending from the bottom of the package, each of the pins extending through the first side wall and having a solder post with an end upon which the wires from the transformers are respectively wrapped and soldered thereon, wherein each of the post ends is substantially parallel to the first side wall, and a portion of each of the terminal pins extends from and is substantially perpendicular to the first side wall, each of the terminal pins further including a lead for mounting onto the surface of the printed circuit board, an end wall substantially perpendicular to the first side wall, wherein at least a portion of the end wall extends below the post ends, and a second side wall substantially parallel to the first side wall, and wherein the wires from the transformers are contained between first and second planes defined, respectively, by an outside surface of the first side wall and an outside surface of the second side wall.

53. The package of claim 52, wherein the portion of the end wall that extends below the post ends includes a central section of a lower surface of the end wall.

54. The package of claim 52, wherein each of the terminal pins has a nonlinear portion disposed within the first side wall, and the nonlinear portion includes a first segment and a second segment substantially perpendicular to the first segment.

55. An electronic surface mount package for mounting onto the surface of a printed circuit board comprising:

a one piece package having an open bottom and a first side wall with a bottom end;

a plurality of toroid transformers each having wires wrapped thereon;

means for encapsulating the plurality of toroid transformers within the package;

a plurality of terminal pins molded within and extending from the bottom of the package, each of the pins extending through the first side wall and having a solder post with an end upon which the wires from the transformers are respectively wrapped and soldered thereon, wherein each of the post ends is substantially parallel to the first side wall, and a portion of each of the terminal pins extends from and is substantially perpendicular to the first side wall, each of the terminal pins further including a lead for mounting onto the surface of the printed circuit board, and a second side wall substantially parallel to the first side wall, and wherein the wires from the transformers are contained between first and second planes defined, respectively, by an outside surface of the first side wall and an outside surface of the second side wall.

56. The package of claim 55, wherein each of the terminal pins has a nonlinear portion disposed within the first side wall, and the nonlinear portion includes a first segment and a second segment substantially perpendicular to the first segment.

* * * * *